United States Patent [19]

Olver

[11] Patent Number: 4,916,407
[45] Date of Patent: Apr. 10, 1990

[54] GAIN VARIATION COMPENSATING CIRCUIT FOR A FEEDFORWARD LINEAR AMPLIFIER

[75] Inventor: Terence E. Olver, Catonsville, Md.

[73] Assignee: Westinghouse Electric Corp., Pittsburgh, Pa.

[21] Appl. No.: 291,600

[22] Filed: Dec. 29, 1988

[51] Int. Cl.⁴ ............................................. H03G 3/10
[52] U.S. Cl. .................................... 330/151; 330/284
[58] Field of Search ............... 330/129, 133, 149, 151, 330/278, 279, 284

[56] References Cited

U.S. PATENT DOCUMENTS 3,825,843  7/1974  Felsburg et al. ................. 330/151 X Primary Examiner—Steven Mottola
Attorney, Agent, or Firm—W. G. Sutcliff

[57] ABSTRACT

A gain compensating circuit for a feedforward cancellation amplifier which compensates inbalance (i.e., changes in gain of the power bank amplifier) due to changes in operating conditions or failures in various circuits in the amplifier. The gain compensating circuit compensates the gain variations and restores balance and fundamental cancellation to the circuit while retaining the highly linear characteristics of the amplifier.

14 Claims, 2 Drawing Sheets

GAIN VARIATION COMPENSATING CIRCUIT FOR A FEEDFORWARD LINEAR AMPLIFIER

CROSS REFERENCE TO RELATED APPLICATION

This application is cross-referenced to U.S. Application entitled "Gain Monitoring of Distortion Cancellation Amplifiers in a Feedforward Linear Amplifier", by Terence E. Olver, Westinghouse Ser. No. 291599 filed 12/29/88.

BACKGROUND OF THE INVENTION (1) Field of the Invention

The present invention is directed to a gain variation compensating circuit for maintaining the linearity of a feedforward linear amplifier when changes in gain of a power bank amplifier or amplifiers vary due to aging or failure conditions. In particular, the present invention compensates for gain variations thus restoring balance and fundamental signal cancellation of the feedforward amplifiers thereby retaining good linearity characteristics of the amplifiers.

(2) Description of Related Art

Feedforward cancellation amplifiers subtract matched pairs of signals for cancellation purposes. Each stage of cancellation has two such cancelers; one for cancelling fundamental signals to obtain distortion products; and the other for cancelling distortion products in the output. Of these two cancellation processes, the most difficult to match and balance is the cancellation of the fundamental signals. Cancellation of fundamental signals is important because loss of balance in fundamental signal cancellation leads to an increase in fundamental signal residue. This in turn drives the distortion cancelling amplifier harder and results in more distortion being generated by the distortion cancelling amplifier. This type of distortion is then directly coupled and added to the output power of the feedforward amplifier. An increase in distortion power in the output of amplifier is equivalent to a reduction in linearity.

Cancellation of fundamental signals is difficult because the cancellation loop includes a power bank which generates the raw power of the amplifier. Matching pairs of signals for cancellation purposes must be done in both amplitude and phase. For high frequency amplifiers covering a frequency band of 2 to 30 MHz, phase matching is straightforward. Since the wavelengths involved are greater than 10 meters, phase matching is stable and varies little with varying conditions. However, amplitude balance is more difficult for the reason that the gain of the amplifiers (such as the power bank) in the loop will vary with varying conditions. In addition, failures in the amplifiers cause reduction in gain, thus upsetting the balance of the amplifier. In particular, when the power bank (main amplifier) fails, the effects of gain variation in the circuit upsets the balance in the circuit.

SUMMARY OF THE INVENTION

An object of the present invention is to counteract the effects of gain variation while maintaining amplitude balance in a fundamental signal cancellation loop even when the power bank (main amplifier) fails.

Another object of the present invention is to provide a first loop which cancels fundamental signal content at the output of a fundamental cancelling coupler and a second loop which amplifies the distortion products, inverts the distortion products and injects them into the output signal to cancel distortion by way of a distortion cancelling coupler.

Another object of the present invention is to continuously monitor the ratio of amplitude of the output of the fundamental cancelling coupler to that of the input reference signal.

A further object of the present invention is to provide compensation of gain variation for a two or more stage cancellation amplifier.

Yet another object of the present invention is to provide compensation in a broadband of frequencies and improve the matching across the entire band.

A still further object of the present invention is to maintain good matching during conditions when the gain varies due to slow changes in amplifier characteristics or due to failures in the amplifiers.

The above-mentioned objects of the present invention are obtained by providing a gain variation compensating circuit for a feedforward cancellation amplifier including means for receiving a reference signal and first and second signals from the feedforward cancellation amplifier and dividing the first and second signals into third and fourth and fifth and sixth signals, respectively, and means for compensating imbalance in the feedforward signals from the receiving means by determining an imbalance and providing compensation, accordingly.

In addition, the present invention provides a gain variation compensating circuit for a feedforward cancellation amplifier. The feedforward cancellation amplifier includes a first loop including an input sampling coupler for receiving input signals, a variable attenuator connected to a first output terminal of the input sampling coupler, a power amplifier connected to the variable attenuator, an output sampling coupler connected to the power amplifier, an attenuator connected to the output sampling coupler, a fundamental cancelling coupler connected to the attenuator, a matching circuit connected to a second output terminal of the input sampling coupler and a first delay circuit connected between the matching circuit and the fundamental cancelling coupler for outputting a reference signal. A second loop is provided which includes the output sampling coupler, the attenuator, the fundamental cancelling coupler, a second delay circuit connected to the output terminal of the output sampling coupler, a distortion amplifier connected to the output of the fundamental cancelling coupler and a distortion cancelling coupler connected between the second delay circuit and the distortion amplifier. The gain variation compensating circuit includes a first hybrid means coupled to receive the output from the first delay circuit, for splitting the output from the first delay circuit into two signals, and a second hybrid means, coupled to receive the output from the fundamental cancelling coupler, for splitting the output from the fundamental cancelling coupler into two signals. A phase detector receives a first one of the two signals from each of the first and second hybrid means, respectively. An amplitude ratio detector receives a second one of the two signals from each of the first and second hybrid means, respectively. A threshold detector is coupled to the amplitude ratio detector for detecting and measuring the ratio of the output of the fundamental canceller to the reference signal from the first delay circuit. A gate circuit is provided for detecting the output from the phase detector and the threshold detector and an up/down driver is provided between the gate and the variable attenuator for driving the variable attenuator and therefore cancelling the fundamental signal so that the amount of distortion that is input to the distortion amplifier is cancelled with the amount of distortion from a delay circuit which is input to the distortion cancelling coupler.

Further, the present invention provides a gain variation compensating circuit for a two or more stage cancellation amplifier.

These objects, together with other objects and advantages which will be subsequently apparent, reside in the details of construction and operation as more fully hereinafter described and claimed, reference being had to the accompanying drawings forming a part hereof, wherein like reference numerals refer to like parts throughout.

DESCRIPTION OF THE PREFERRED EMBODIMENTS

Feedforward amplifiers depend on good fundamental signal cancellation from cancelling circuits therein in order to keep self-generated distortion at a minimum. Changes in gain of the power bank amplifiers (main amplifiers) due to changes and conditions or failures can upset this cancellation resulting in an increase in distortion in the output of the amplifier. The present invention solves this problem by compensating for the gain variations and thus restoring balance and cancellation and retaining acceptable linearity characteristics of the amplifiers.

Figure 1:
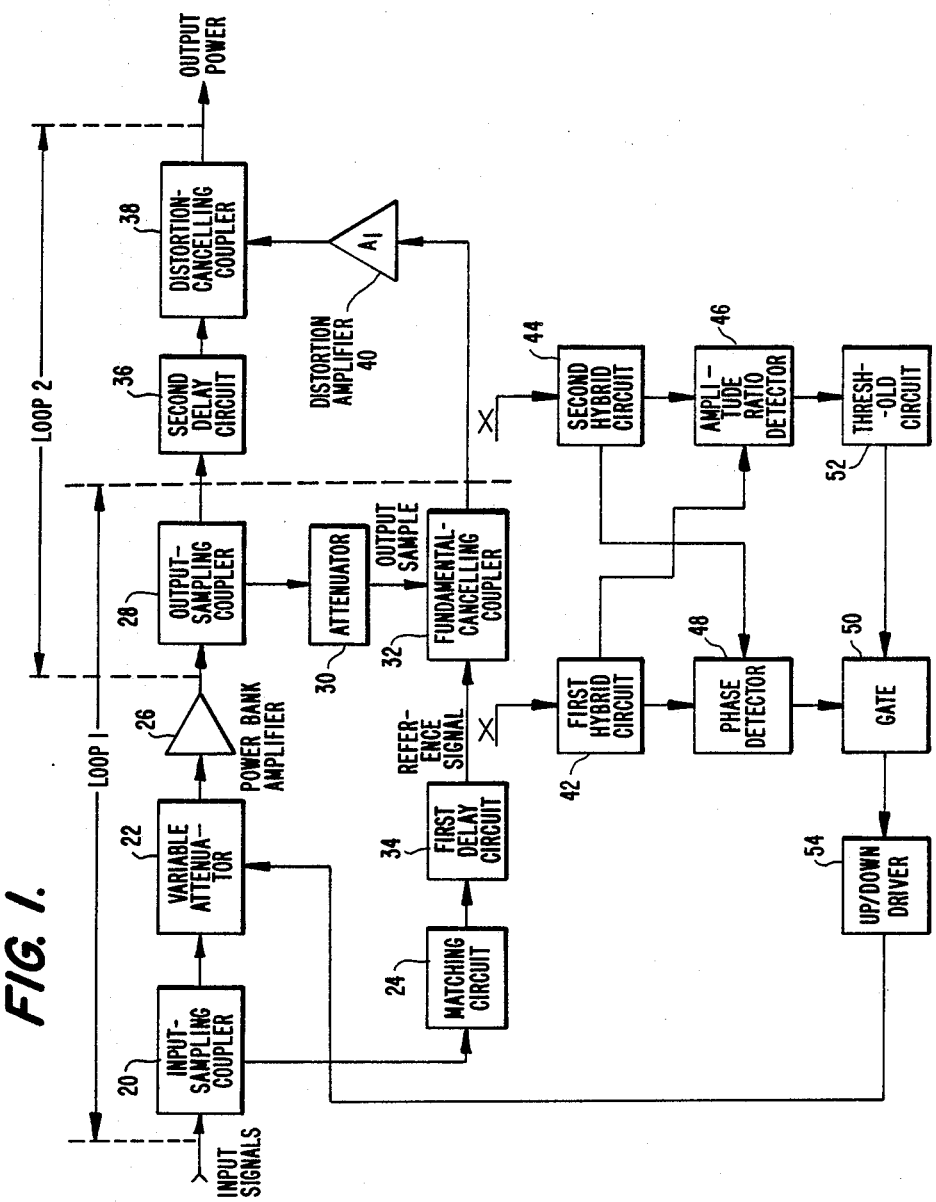
FIG. 1 is a single stage feedforward cancellation amplifier having a gain variation compensating circuit according to a first embodiment of the present invention.

FIG. 1 is a first embodiment of the present invention in which a broadband amplifier having a single stage feedforward cancellation amplifier and using conventional components is shown. The circuit includes a first loop 1 and a second loop 2 which overlaps loop 1. Loop 1 cancels the fundamental signal content at the output of a fundamental cancelling coupler. Loop 2 amplifies the distortion products which remain after the cancelling action of loop 1 and then inverts these distortion products and injects them into the output so as to cancel distortion by way of a distortion cancelling coupler.

Loop 1 of the broadband amplifier includes an input sampling coupler 20 which receives input signals and outputs signals to a variable attenuator 22 and a matching circuit 24. The variable attenuator 22 outputs signals to a power bank amplifier (main amplifier) 26. Any standard or conventional main amplifier (e.g., a high quality wideband class A linear amplifier) having adequate bandwidth and good phase and amplitude response can be employed, or a main amplifier such as that set forth in U.S. Application entitled "Power Amplifier Combiner for Improving Linearity of an Output", by Terence Olver, (Westinghouse Disclosure No. 54,259) incorporated by reference herein can be used.

The power bank amplifier 26 outputs a signal to the output sampling coupler 28 which provides an output to an attenuator 30 which outputs a sample to a fundamental cancelling coupler 32. The matching circuit 24 outputs a signal to a delay circuit 34 which then outputs the reference signal to the fundamental cancelling coupler 32.

Loop 2 includes the output sampling coupler 28, the attenuator 30 and the fundamental cancelling coupler 32. Loop 2 also includes a second delay circuit 36 which receives the output from the output sampling coupler 28 and inputs a delayed signal to a distortion cancelling coupler 38. The fundamental cancelling coupler 32 outputs a signal to a distortion amplifier 40 which then provides a second input to the distortion cancelling coupler 38. The distortion cancelling coupler 38 combines the delayed signal with the distortion amount to cancel distortion and output a signal that is substantially distortion free. As noted above, the circuits in the feedforward cancellation amplifier are conventional circuits.

The main features of the present invention include the gain variation compensating circuit which includes a first hybrid circuit 42 coupled to receive the reference signal output from the first delay circuit 34 and outputs first and second signals, and a second hybrid circuit 44 which receives the output from the fundamental cancelling coupler 32 and outputs first and second output signals. The first signal output from the first hybrid circuit 42 is input to an amplitude ratio detector 46 and the first signal output from the second hybrid circuit 44 is input to a phase detector 48. The second output signal from the first hybrid circuit 42 is also input to the phase detector 48 and the second output signal from the second hybrid circuit 44 is also input to the amplitude ratio detector 46. The phase detector 48 provides an output to a gate circuit 50 and the amplitude ratio detector 46 provides an output to a threshold circuit 52. The threshold circuit 52 then outputs a signal to the gate circuit 50 which gates the signal from the phase detector 48 and the threshold circuit 52 and outputs a signal to an up/down driver 54. The up/down driver 54 then inputs a signal to the variable attenuator 22. The variable attenuator 22 then operates to attenuate, more or less, the signal from the input sampling coupler 20 in accordance with the signal from the up/down driver 54. These circuit elements are all conventional. The operation of the circuit will now be described.

Cancellation is not perfect in either loop 1 or loop 2. Under normal operation, in loop 1, a greater amount of fundamental signal residue will exist at the output of the fundamental cancelling coupler 32 than distortion signals. This is due to imperfect fundamental cancellation occurring across a frequency band of operation and also due to distortion products which have relatively low power (e.g., $-30$ dB) compared to fundamentals in the main amplifier. Under degraded matching conditions which result in imbalance of the circuit, the fundamental residue rises in power. This is undesirable because the distortion generated by the distortion amplifier in loop 2 will increase and contaminate the output signal.

Two signals are input to the fundamental cancelling coupler 32. One is a reference signal which is coupled directly from the input sampling coupler 20 to the matching circuit 24 and the delay circuit 34. The reference signal varies in amplitude as the input drive to the circuit varies. The other signal is a sample of the power bank amplifier 26 output. This signal also varies in level with respect to the input, but is contaminated with distortion products. The signal from the power bank amplifier 26 also varies across a frequency band in both phase and amplitude according to the transfer characteristics of the power bank amplifier 26 and all the circuit components in loop 1. The delay circuit 34 and the matching circuit 24 match the characteristics of the reference signal to the output signal from the attenuator 30 for subtraction in the fundamental cancelling coupler 32.

The present invention continuously monitors the ratio of the amplitude of the output from the fundamental cancelling coupler 32 to the input reference signal input from the first delay circuit 34. The amplitude of this ratio is a measure of the degree of matching of the two input signals to the fundamental cancelling coupler 32. The phase detector 48 detects the phase of the output signal from the fundamental cancelling coupler 32 and compares the phase of the reference signal with the phase of the output signal to determine whether the signal has fallen or risen. The phase relationship of the two signals (normally with good phase matching levels either 0° or 180°) denoting which of the two signals is larger.

Under normal conditions of operation having a good match between the two inputs to the fundamental cancelling coupler 32, the input signal is cancelled and the ratio is small. The gain of each signal, the reference signal and the output sample from the attenuator 30, from the input sampling coupler 20 to a subtraction circuit (not shown) in the fundamental cancelling coupler 32 must therefore be substantially equal. If a minor failure occurs in the power bank amplifier 26, the gain of the output sample from the attenuator 30 drops. A large increase in the amplitude ratio occurs such that the reference signal from the first delay circuit 34 is larger than the output sample from the attenuator 30. This latter condition is determined by the relative phase of the output of the fundamental cancelling coupler 32 with respect to the reference signal. These conditions are then used in a negative feedback loop which operates slowly to decrease the attenuation of the variable attenuator 22 at the input of the power bank amplifier 26 as shown in FIG. 1. This decrease in attenuation adjusts the gain of the input sample from the attenuator 30 to its former value and balances the operation of the fundamental cancelling coupler 32.

Operation of the circuit in FIG. 1 is as follows. A sample of the reference signal from the first delay circuit 34 and an output from the fundamental cancelling coupler 32 are coupled to the first hybrid circuit 42 and the second hybrid circuit 44, respectively. These hybrid circuits are 3 dB hybrids. Each sample is split into two signals, i.e., first and second signals output from the first hybrid circuit 42 and a first and second signal output from the second hybrid circuit 44. One of the two signals from each hybrid is used to drive the phase detector 48 and the other drives the amplitude ratio detector 46. The phase detector 48 incorporates a limiter so that the output of the phase detector 48 is either +volts (+V) or −volts (−V) corresponding to 0° or 180° in accordance with which of the samples is the larger. The amplitude ratio detector 46 measures the ratio of the output from the fundamental cancelling coupler 32 to the reference signal from the first delay circuit 34. Normally, this signal is small and is approximately less than −20 dB. The threshold detector 52 is used to generate an output signal if the ratio is determined to exceed a predetermined threshold level corresponding to loss of cancellation of, for example, 6 dB. The output from the threshold detector 52 is input to the gate circuit 50 which also receives an output from the phase detector 48. This output gates the output of the phase detector 48 (±V) to the up/down driver 54 which drives the variable attenuator 22 at the input to the power bank amplifier 26 so as to more or less attenuate the input signals. The time constant on the negative feedback loop is chosen to be large, approximately up to a minute, so that the feedback acts slowly in correcting changes in gain.

Both the phase detector 48 and the amplitude ratio detector 46 are broadband devices and operate over a dynamic range greater than 40 dB. Also, the distortion products generated by the distortion amplifier 40 directly add to the output power, but since they decrease rapidly with fundamental residue drive which is a function of the level of the input signal drive to the input sampling coupler 29, these products become negligible in the output when the input signal drive to the amplifier is below a certain level. This drive level is the lower limit of the dynamic range over which the compensating circuits must operate. It is less than the lower limit corresponding to the input dynamic range of an amplifier which is typically 60 dB.

The phase detector 48 detects which way the variable attenuator 22 should act on the signal, i.e., either to increase or decrease the signal to the power bank amplifier 26. The attenuator 22 can be either a variable attenuator or continuous attenuator depending on the type of circuit desired and the various characteristics of the circuit.

Figure 2:
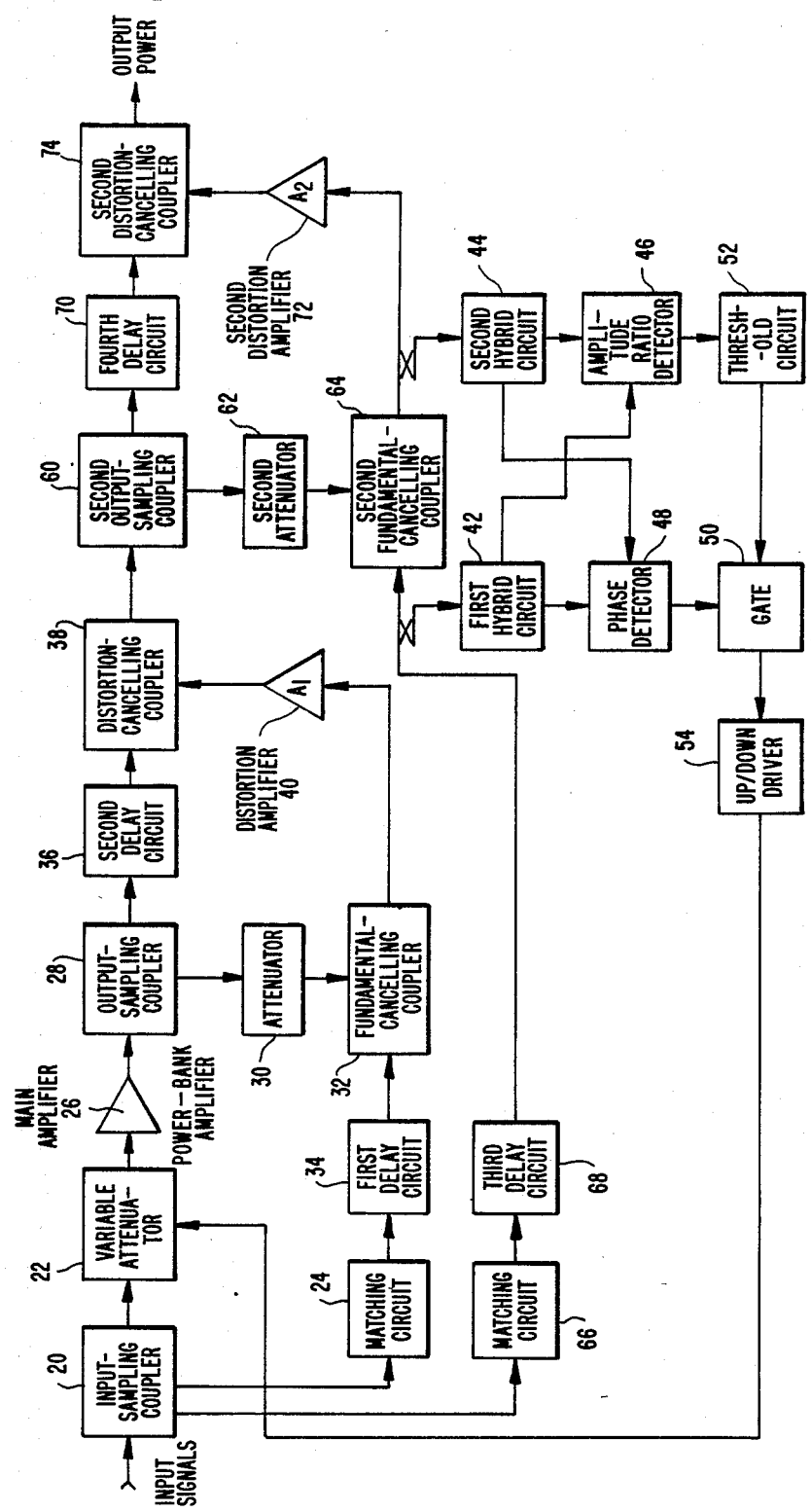
FIG. 2 is a two-stage feedforward cancellation amplifier having a gain compensating circuit according to a second embodiment of the present invention.

FIG. 2 is a two-stage feedforward cancellation amplifier having the gain compensating circuit of the present invention shown in FIG. 1. As mentioned above, the circuit elements are conventional as are the additional elements in FIG. 2. The gain compensating circuit of the present invention provides better compensation for a two or more stage cancellation amplifier. FIG. 2 includes a second output sampling coupler 60 coupled to receive the output from the distortion cancelling coupler 38. A second attenuator 62 is connected to the second output sampling coupler 60, and a second fundamental cancelling coupler 64 is connected to the second attenuator 62. A second matching circuit 66 is connected to the input sampling coupler 20 and a third delay circuit 68 is connected between the second matching circuit 66 and the second fundamental cancelling coupler 64. The gain compensating circuit is coupled between the input and output of the fundamental cancelling coupler 64. The gain compensating circuit is the same as that in FIG. 1 and includes first and second hybrid circuits 42 and 44, phase detector 48, amplitude ratio detector 46, gate 50, threshold circuit 52 and up/down driver 54. The up/down driver 54 is connected to the variable attenuator 22. A fourth delay circuit 70 is connected to the output of the second output sampling coupler 60. A second distortion amplifier 72 is connected to the output of the second fundamental cancelling coupler 64 and a second distortion cancelling coupler 74 is connected between the fourth delay circuit 70 and the second distortion amplifier 72.

The operation of the circuit in FIG. 2 is substantially the same as that of FIG. 1 except that an additional stage is added and will not be discussed in detail for purposes of brevity.

Better operation is obtained in the circuit of FIG. 2 because the sample of the output of the fundamental cancelling coupler 64 in the second stage is cleaner, i.e., is less contaminated with distortion products, than the single stage in FIG. 1. That is, the amount of distortion compared to fundamental in the second stage is much lower than compared with the amount of distortion to fundamental in the first stage. The same amount of fundamental is present in both the output of the fundamental cancelling couplers 32 and 64, but the second stage has less distortion due to the cancellation action of the first stage in reducing distortion coupled into the second stage. With a cleaner sample of fundamental signal residue provided into the compensating circuit, the threshold of the amplitude ratio may be set lower to have a tighter control in the gain compensating circuit.

The present application can be employed in any type of device that requires a high degree of linearity. The output of a circuit employing the present invention is approximately 10,000 times more linear than conventional amplifiers.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention and the appended claims and their equivalents.

What is claimed is:

1. A gain variation compensating circuit for a feedforward cancellation amplifier, comprising:
   means for receiving a reference signal and first and second signals from the feedforward cancellation amplifier and for dividing each of the first and second signals into third and fourth, and fifth and sixth signals, respectively, said receiving means comprising:
   first hybrid means, coupled to receive the first signal, for dividing the first signal into third and fourth signals; and
   second hybrid means, coupled to receive the second signal, for dividing the second signal into fifth and sixth signals; and
   means, connected to said receiving means, for compensating imbalance in the feedforward cancellation amplifier by receiving the third and fifth, and fourth and sixth signals from said receiving means, determining an imbalance, and providing compensation accordingly, said compensating means comprising:
   a phase detector, coupled to said first and second hybrid means, for receiving the third and fourth signals from said first and second hybrid means;
   amplitude means, coupled to said first and second hybrid means, for receiving the fourth and sixth signals from said first and second hybrid means;
   a threshold detector coupled to said amplitude means;
   gate means, coupled to said threshold detector and said phase detector, for gating outputs from said phase detector and said threshold detector; and
   an up/down driver, coupled to said gate means for providing a signal to compensate for imbalance in the feedforward amplifier.

2. A gain variation compensating circuit according to claim 1, wherein said amplitude means comprises an amplitude ratio detector, wherein said threshold detector generates an output if a ratio from said amplitude ratio detector exceeds a fixed threshold level, wherein said first and second hybrid means comprise 3 dB hybrids, and wherin said phase detector and said amplitude ratio detector are broad band devices operating over a dynamic range greater than 40 dB.

3. A gain variation compensating circuit for a feedforward cancellation amplifier, comprising:
   a first loop including:
   an input sampling coupler, connected to receive input signals, having an input terminal and having first and second output terminals;
   attenuator means, connected to a first output terminal of said input sampling coupler, for attenuating the input signals;
   a power amplifier connected to said attenuator means;
   an output sampling coupler connected to said power amplifier;
   an attenuator connected to said output sampling coupler;
   a fundamental cancelling coupler connected to said attenuator;
   a matching circuit connected to a second output terminal of said input sampling coupler; and
   a first delay circuit connected between said matching circuit and said fundamental cancelling coupler for outputting a reference signal;
   a second loop including:
   said output sampling coupler;
   said attenuator;
   said fundamental cancelling coupler;
   a second delay circuit connected to an output terminal of said output sampling coupler;
   a distortion amplifier connected to the output of said fundamental cancelling coupler; and
   a distortion cancelling coupler connected between said second delay circuit and said distortion amplifier;
   first hybrid menas, coupled to receive the output from said first delay circuit, for dividing the output from said first delay circuit into two signals;
   second hybrid means, coupled to receive the output from said fundamental cancelling coupler for dividing the output from said fundamental cancelling coupler into two signals;
   a phase detector, coupled to said first and second hybrid means, for receiving a first one of the two signals from each of said first and second hybrid means, respectively;
   amplitude means, coupled to said first and second hybrid means, for receiving a second one of the two signals from each of said first and second hybrid means, respectively;
   a threshold detector coupled to said amplitude means;
   gate means, coupled to said threshold detector and said phase detector, for gating the outputs of said phase detector and said threshold detector; and
   an up/down driver, coupled between said gate means and said attenuator means, for driving said attenuator means.

4. A gain variation compensating circuit according to claim 3, wherein said attenuator means comprises a variable attenuator.

5. A gain variation compensating circuit according to claim 3, wherein said attenuator means comprises a continuous attenuator.

6. A gain variation compensating circuit according to claim 3, wherein said amplitude means comprises an amplitude ratio detector, for detecting and measuring the ratio of the output from said fundamental cancelling coupler to the reference signal from said first delay circuit.

7. A gain variation compensating circuit according to claim 6, wherein said threshold detector generates an output if the ratio from said amplitude ratio detector exceeds a fixed threshold level.

8. A gain variation compensating circuit according to claim 7, wherein said phase detector and said amplitude ratio detector are broad band devices and operate over a dynamic range greater than 40 dB.

9. A gain variation compensating circuit according to claim 3, further comprising:
   a second matching circuit connected to said input sampling coupler;
   a third delay circuit connected to said second matching circuit;
   a second output sampling coupler connected to said distortion cancelling coupler;
   a second attenuator connected to said second output sampling coupler;
   a fourth delay circuit, connected to said second output sampling coupler;
   a second fundamental cancelling coupler connected between said third delay circuit and said second attenuator, said first and second hybrid circuits being connected respectively to an input and output of said second fundamental cancelling coupler;
   a second distortion amplifier connected to the output of said second fundamental cancelling coupler; and
   a second distortion cancelling coupler connected to said fourth delay circuit and said second distortion amplifier.

10. A gain variation compensating circuit for a feedforward cancellation amplifier including a first loop having an input sampling coupler connected to receive input signals, attenuator means connected to a first output terminal of the input sampling coupler, a power amplifier connected to the attenuator means, an output sampling coupler connected to the power amplifier, an attenuator connected to the output sampling coupler, a fundamental cancelling coupler connected to the attenuator, a matching circuit connected to a second output terminal of the input sampling coupler, and a first delay circuit connected between the matching circuit and the fundamental cancelling coupler for outputting a reference signal, and a second loop having the output sampling coupler, the attenuator, the fundamental cancelling coupler, a second delay circuit connected to an output terminal of the output sampling coupler, a distortion amplifier connected to the output of the fundamental cancelling coupler, and a distortion cancelling coupler connected between said delay circuit and said distortion amplifier, said gain variation compensating circuit comprising:
   first hybrid means, coupled to receive the output from the first delay circuit, for dividing the output from the first delay circuit into two signals;
   second hybrid means, coupled to receive the output from the fundamental cancelling coupler, for dividing the output from the fundamental cancelling coupler into two signals;
   a phase detector, coupled to said first and second hybrid means, for receiving a first one of the two signals from each of said first and second hybrid means, respectively;
   amplitude means, coupled to said first and second hybrid means, for receiving a second one of the two signals from each of said first and second hybrid means, respectively;
   a threshold detector coupled to said amplitude means;
   gate means, coupled to said threshold detector and said phase detector, for gating the outputs of said phase detector and said threshold detector; and
   an up/down driver, coupled between said gate means and the attenuator means, for driving the attenuator means.

11. A gain variation compensating circuit according to claim 10, wherein said amplitude means comprises an amplitude ratio detector, for detecting and measuring the ratio of the output from the fundamental cancelling coupler to the reference signal from the first delay circuit.

12. A gain variation compensating circuit according to claim 11, wherein said threshold detector generates an output if the ratio from said amplitude ratio detector exceeds a fixed threshold level.

13. A gain variation compensating circuit according to claim 12, wherein said phase detector and said amplitude ratio detector are broad band devices and operate over a dynamic range greater than 40 dB.

14. A gain variation compensating circuit according to claim 10, further comprising:
   a second matching circuit connected to the input sampling coupler;
   a third delay circuit connected to said second matching circuit;
   a second output sampling coupler connected to the distortion cancelling coupler;
   a second attenuator connected to said output sampling coupler;
   a fourth delay circuit, connected to said second output sampling coupler;
   a second fundamental cancelling coupler connected between said third delay circuit and said second attenuator, said first and second hybrid circuits being connected respectively to the input annd output of said second fundamental cancelling coupler;
   a second distortion amplifier connected to the output of said second fundamental cancelling coupler; and
   a second distortion cancelling coupler connected to said fourth delay circuit and said second distortion amplifier.

* * * * *